United States Patent
Lee et al.

(10) Patent No.: US 6,714,038 B2
(45) Date of Patent: Mar. 30, 2004

(54) APPARATUS FOR CONTROLLING INPUT TERMINATION OF SEMICONDUCTOR MEMORY DEVICE AND METHOD FOR THE SAME

(75) Inventors: Byong-Kwon Lee, Suwon (KR); Kwang-Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/171,717

(22) Filed: Jun. 14, 2002

(65) Prior Publication Data

US 2003/0012046 A1 Jan. 16, 2003

(30) Foreign Application Priority Data

Jul. 13, 2001 (KR) ........................................ 2001-42329

(51) Int. Cl.[7] ........................ H03K 19/00; H03K 19/003
(52) U.S. Cl. .......................................... 326/16; 326/30
(58) Field of Search ........................ 326/30, 83, 21–23, 326/16; 333/17.3, 32; 714/718; 365/201

(56) References Cited

U.S. PATENT DOCUMENTS

| | | | | | |
|---|---|---|---|---|---|
| 5,596,757 | A | * | 1/1997 | Smith | 713/324 |
| 5,731,711 | A | * | 3/1998 | Gabara | 326/30 |
| 6,054,881 | A | * | 4/2000 | Stoenner | 327/112 |
| 6,313,659 | B1 | * | 11/2001 | Bosnyak et al. | 326/30 |

FOREIGN PATENT DOCUMENTS

JP  05083114 A  *  4/1993  ....... H03K/19/0175

* cited by examiner

*Primary Examiner*—James H Cho
(74) *Attorney, Agent, or Firm*—F. Chau & Associates LLC

(57) ABSTRACT

An apparatus and method for controlling an input termination of a semiconductor memory device that easily detect and analyze defects, functions and reliability of the device by controlling operations of the input termination. The apparatus comprises an input termination circuit for matching an impedance of a transmission line, a control circuit for processing test commands and outputting control signals in response to said processing, and a switching circuit for selectively turning on/off the input termination circuit in response to the control signals output from the control circuit.

21 Claims, 2 Drawing Sheets

APPARATUS FOR CONTROLLING INPUT TERMINATION OF SEMICONDUCTOR MEMORY DEVICE AND METHOD FOR THE SAME

CROSS-REFERENCE TO RELATED APPLICATION

This application claims priority to Korean Patent Application No. 2001-42329 filed on Jul. 13, 2001.

BACKGROUND

1. Technical Field

The present invention relates to an apparatus and method for controlling a semiconductor memory device, and more particularly, to an apparatus and method for controlling the operation of an input termination of a semiconductor memory device, so that the input termination can be turned off during a testing operation to detect and analyze defects, functions, and reliability of the semiconductor device.

2. Description of Related Art

Typically, an ultrahigh-speed semiconductor memory device having a data transmission rate of greater than 1 Gbps will comprise an input termination. The input termination is used to reduce the skew on a signal transmission line that is caused by reflection waves due to impedance mismatches between sources during a reading or writing operation.

For instance, when a cache memory (such as SRAM) directly transfers and receives data to and from a central processing unit (CPU), if there is an impedance mismatch between the transmission line and the receiving terminal of the SRAM, the signal transmitted to the SRAM will be skewed. In other words, in case of an external input signal having a low frequency, there is a time gap between the falling time of a current input signal and the rising time of a next input signal. In case of an external input signal having a high frequency, the falling time of a current input signal will overlap with the rising time of a next input signal before the falling time of the current input signal completely ends. Thus, a skewed signal is transmitted from the CPU through the transmission line to the SRAM.

FIG. 1 is a circuit diagram of a conventional impedance match control circuit of a semiconductor memory device. The impedance match control circuit comprises an input terminal P1, an input termination 10, and a normal receiver 12 for receiving an input signal through the input terminal circuit 10.

The input termination 10, which comprises resistors R1 and R2 serially connected between a supply voltage VDD and a ground voltage, is used to match the impedance of the input terminal P1 and the transmission line connected to the input terminal P1, thereby reducing skew of the input signal.

However, since the input termination 10 generates an excessive amount of current through the two resistors R1 and R2 in response to the supply voltage VDD, it is difficult to detect leakage current (that may be caused by, e.g., a manufacturing defect) during the transformation of the received input signal by the normal receiver 12, which results in an excess amount of current flow in the input termination.

Therefore, a need exists for controlling the input termination in a manner that would enable detection of leakage current. Further, it would be advantageous to be able to turn the input termination off to allow one to test a semiconductor memory device within an allowable current range of test equipment.

SUMMARY OF THE INVENTION

The present invention is directed to an apparatus and method for controlling the operation of an input termination of a semiconductor memory device, so that the input termination can be turned off during a testing operation of a semiconductor device to detect and analyze defects, functions and reliability of the semiconductor device.

According to one aspect of the present invention, an apparatus for controlling an input termination of a semiconductor memory device comprises an input termination circuit for matching an impedance of a transmission line, a control circuit for processing test commands and outputting control signals in response to said processing, and a switching circuit for selectively turning on/off the input termination circuit in response to the control signals output from the control circuit.

According to another aspect of the present invention, an apparatus for controlling an input termination of a semiconductor memory device, comprises a pad for receiving a first control signal to control an input termination circuit, and a switching circuit that selectively turns on/off the input termination circuit in response to the first control signal.

According to yet another aspect of the present invention, a semiconductor memory device, comprises an input termination circuit for matching an impedance of a transmission line connected to the semiconductor device, and a pad for receiving a control signal that one of activates and deactivates the input termination circuit, wherein the input termination circuit is deactivated to prevent leakage current from flowing in the input termination circuit.

According to further aspect of the present invention, a method for controlling an input termination of a semiconductor memory device, comprises the steps of outputting a control signal to deactivate an input termination, when a testing procedure is to be performed for the semiconductor device, and deactivating a plurality of switches to electrically isolate the input termination, and thus, prevent leakage current from flowing in the input termination.

These and other aspects, features, and advantages of the present invention will become apparent from the following detailed description of preferred embodiments, which is to be read in conjunction with the accompanying figures.

DETAILED DESCRIPTION OF PREFERRED EMBODIMENTS

Figure 1:
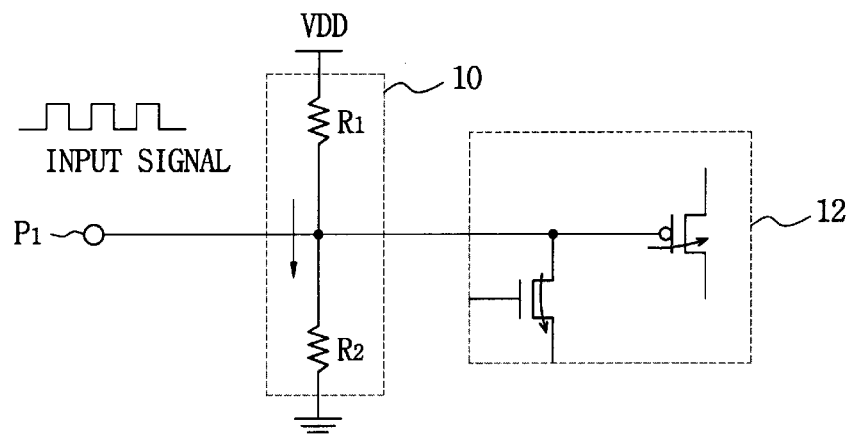
FIG. 1 is a circuit diagram of a conventional impedance match controlling circuit of a semiconductor memory device.
Figure 2:
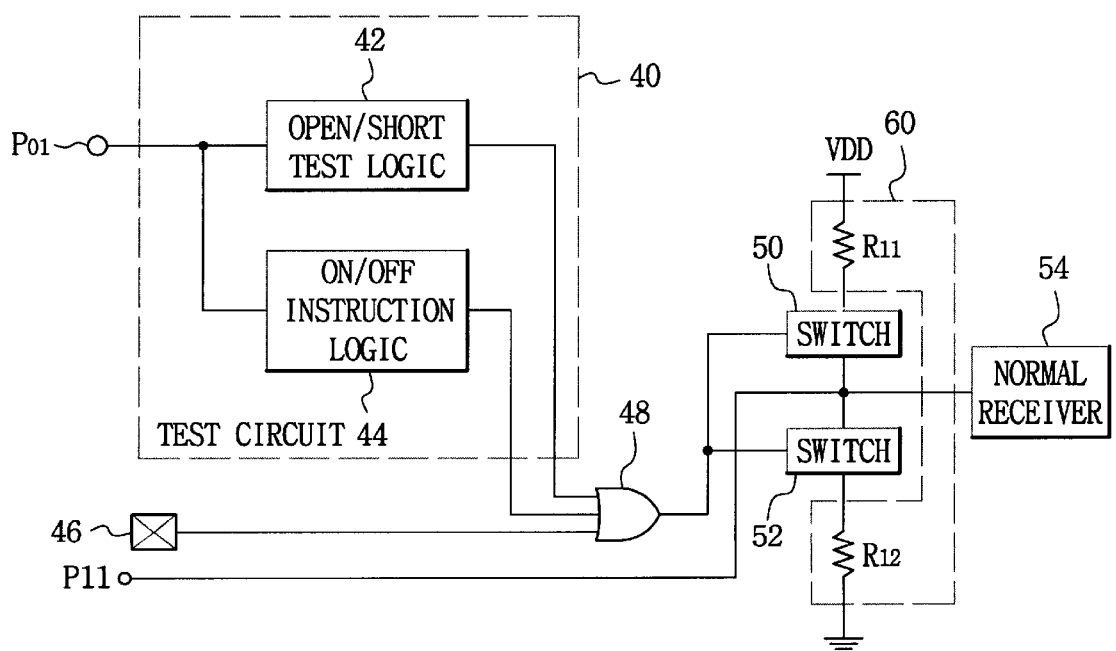
FIG. 2 is a circuit diagram of an apparatus for controlling an input termination of a semiconductor memory device according to an embodiment of the present invention.

FIG. 2 is a circuit diagram of an apparatus for controlling an input termination of a semiconductor memory device according to an embodiment of the present invention. The apparatus comprises an input terminal P11 for receiving an input signal from a transmission line, a test command input terminal $P_{01}$ for receiving test commands, an input termination circuit 60 for matching the impedance of the transmission line and the input terminal P11, a normal receiver 54 for receiving the input signal through the input termination circuit 60, a test circuit 40 comprising an open/short test logic circuit 42 and an on/off instruction logic circuit 44, a pad 46 for receiving an input termination on/off control signal, an OR gate 48 for performing an OR logical operation of the output signals of the test circuit 40 and the input termination on/off control signal from the pad 46 to output an input termination on/off control signal that selectively activates/deactivates first and second switches 50 and 52 for turning on and turning off the input termination circuit 60.

The input termination circuit 60 comprises first and second resistors $R_{11}$ and $R_{12}$ serially connected between a supply voltage VDD and a ground voltage. The first and second switches 50 and 52 are serially connected between the first and second resistors $R_{11}$ and $R_{12}$. In one preferred embodiment, the first and second switches 50 and 52 comprise PMOS or NMOS transistors, respectively.

The test circuit 40 tests for defects of the semiconductor memory device by processing test commands received through a test input pin (unshown) of the semiconductor device and outputting control signals to deactivate the input termination circuit 60. The test circuit 40 stores test start/stop commands and outputs an input termination off control signal if the received command is similar to a previous command. The open/short test logic circuit 42 receives a signal output from the test input pin, and outputs the open/short test commands of the input pin. The on/off instruction logic circuit 44 receives on/off test commands, and outputs an input termination on/off control signal. The logic circuits 42 and 44 comprise registers to store received commands.

For example, if the test circuit 40 receives an open/short test command and an input termination off command, the test circuit 40 stores the received commands in the logic circuits 42 and 44. If the received open/short test command of the input pin is similar to a previously stored open/short test command of the input pin, the test circuit 40 outputs an input termination off control signal and the received open/short test command of the input pin.

Further, the pad 46 can directly receive an on/off input termination command which is logically ORed with the control signals output from the test circuit 40. The first and second switches 50 and 52 are deactivated in response to an input termination off control signal output from the test circuit 40 or the pad 46, thereby electrically isolating the input termination circuit 60. As a result, leakage current is prevented from flowing in the input termination circuit 60, and can be easily detected.

Therefore, in a preferred embodiment of the present invention, the first and second switches 50 and 52 may be deactivated in response to (i) a test command for analyzing AC/DC function, (ii) an open/short test command of the input pin, and (iii) an input termination off command output from the pad 46, thereby preventing the generation of leakage current in the input termination circuit 60. Since the generation of the leakage current is prevented in the input termination circuit 60, the reliability of the normal receiver 54 may be tested, e.g., in terms of the leakage current generated in the normal receiver 54.

Figure 3:
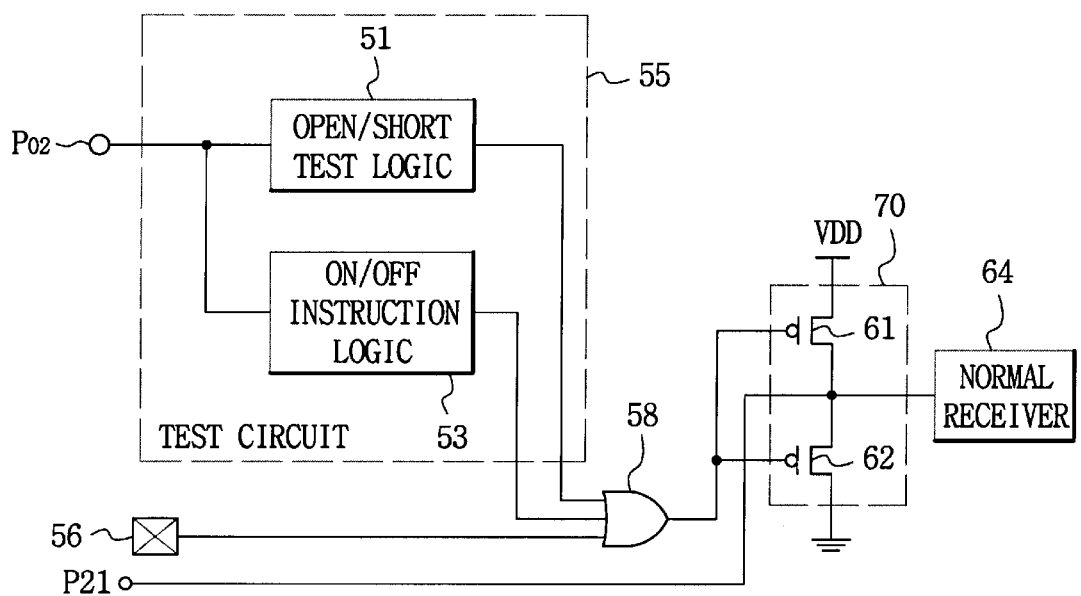
FIG. 3 is a circuit diagram of an apparatus for controlling an input termination of a semiconductor memory device according to another embodiment of the present invention.

FIG. 3 is a circuit diagram of an apparatus for controlling an input termination of a semiconductor memory device according to another embodiment of the present invention. The apparatus comprises an input terminal P21 for receiving an input signal from a transmission line, a test command input terminal $P_{02}$ for receiving test commands, an input termination circuit 70, which is connected between a supply voltage VDD and a ground voltage, for matching the impedance of the transmission line and the input terminal P21, a normal receiver 64 for receiving the input signal through the input termination 70, a test circuit 55 comprising an open/short test logic circuit 51 and an on/off instruction logic circuit 53, a pad 56 for receiving an input termination on/off control signal, an OR gate 58 for performing an OR logical operation of the output signals of the test circuit 55 and the input termination on/off control signal from the pad 56 to output an input termination on/off control signal to selectively activate/deactivate the input termination circuit 70.

The input termination circuit 70 comprises first and second switches 61 and 62 between the supply voltage VDD and the ground voltage. In this embodiment, the switches 61 and 62 function as resistors when they are activated, so that the input termination circuit 70 is activated in response to the activation of the switches 61 and 62. When the first and second switches 61 and 62 are selectively deactivated, the input termination circuit 70 is deactivated, thereby preventing leakage current from flowing in the input termination circuit 70. In a preferred embodiment, the first and second switches 61 and 62 comprise PMOS or NMOS transistors, in which the switches 61 and 62 are activated/deactivated by controlling gates thereof.

The test circuit 55 tests for defects of the semiconductor memory device by processing test commands received through a test input pin (unshown) of the semiconductor device and outputting control signals to deactivate the input termination circuit 70. The test circuit 55 stores test start/stop commands and outputs an input termination off control signal if the received command is similar to a previous command. The open/short logic circuit 51 receives a signal output from the test input pin, and outputs the open/short test commands of the input pin. The on/off instruction logic circuit 53 receives on/off commands, and outputs the first input termination on/off control signal. The logic circuits 51 and 53 comprise registers to store commands.

For example, if the test circuit 55 receives an open/short test command and an input termination off command, the test circuit 55 compares the received open/short test command of the input pin with a previously stored open/short test command of the input pin. If the received open/short test command of the input pin is similar to the previously stored open/short test command of the input pin, the test circuit 55 outputs an input termination off control signal and the received open/short test command of the input pin.

Further, the pad 56 can directly receive an on/off input termination command which is logically ORed with the control signals output from the test circuit 55. The first and second switches 61 and 62 are deactivated in response to the input termination off control signal output from the test circuit 55 or the pad 56, so that the input termination circuit 70 is deactivated.

Therefore, in a preferred embodiment of the present invention, the first and second switches 61 and 62 are deactivated in response to (i) a test command for analyzing AC/DC function, (ii) an open/short test command of the input pin and (iii) an input termination off command output from the pad 56, thereby preventing leakage current from flowing in the input termination circuit 70. Since the generation of the leakage current is prevented in the input termination circuit 70, the reliability of the normal receiver 64 may be tested, e.g., in terms of the leakage current generated in the normal receiver 64, and AC/DC characteristics of the semiconductor memory device may be easily analyzed.

Further, since a greater amount of current to be consumed by an input termination may be saved by deactivating the input termination, a test of a semiconductor memory device may be performed by using less expensive equipment and over an allowable range of current.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for controlling an input termination of a semiconductor device, comprising:
    an input termination circuit for matching an impedance of a transmission line;
    a test circuit for processing test commands for testing a semiconductor device and outputting control signals in response to said processing of said test commands; and
    a switching circuit for selectively turning on/off the input termination circuit in response to the control signals output from the test circuit.

2. The apparatus of claim 1, wherein the switching circuit comprises first and second switches that are serially connected between resistors of the input termination circuit.

3. The apparatus of claim 2, wherein the first and second switches comprise transistors.

4. The apparatus of claim 1, wherein the test circuit comprises registers to store the test commands.

5. The apparatus of claim 1, wherein the first and second switches are turned off in response to a control signal comprising an input termination off command such that the input termination circuit is turned off to prevent leakage current from flowing through the input termination circuit.

6. The apparatus of claim 1, wherein the switching circuit comprises first and second transistors serially connected between a power supply voltage and a ground voltage, wherein the transistors function as resistors for the input termination circuit when the transistors are activated.

7. The apparatus of claim 1, wherein the test circuit comprises an open/short test logic circuit and an on/off instruction logic circuit.

8. An apparatus for controlling an input termination of a semiconductor memory device, comprising:
    a pad for receiving a first control signal to control an input termination circuit;
    a switching circuit that selectively turns on/off the input termination circuit in response to the first control signal;
    a test circuit for receiving test commands and outputting a second control signal in response to the test commands; and
    an OR gate having input terminals connected to the output of the test circuit and the pad, for outputting a third control signal in response to the first and second control signals to selectively turn on/off the input termination circuit in response to the third control signal.

9. The apparatus of claim 8, wherein the switching circuit comprises first and second switches serially connected between resistors of the input termination circuit.

10. The apparatus of claim 9, wherein the first and second switches comprise transistors.

11. The apparatus of claim 9, wherein the first and second switches are turned off to prevent leakage current from flowing in the input termination circuit.

12. The apparatus of claim 8, wherein the test circuit comprises an open/short test logic circuit and an on/off instruction logic circuit.

13. A semiconductor device, comprising:
    an input termination circuit for matching an impedance of a transmission line connected to the input of a semiconductor memory device;
    a test circuit for processing test commands for testing the semiconductor memory device and outputting a control signal in response to said processing of said test commands;
    a pad for receiving the control signal that one of activates and deactivates the input termination circuit, wherein the input termination circuit is deactivated to prevent leakage current from flowing in the input termination circuit during a testing procedure.

14. The device of claim 13, wherein the input termination circuit comprises first and second resistors and first and second switches serially connected between the first and second resistors.

15. The device of claim 14, wherein the first and second switches are transistors.

16. The device of claim 13, wherein the input termination circuit comprises first and second transistors serially connected between a supply voltage and a ground voltage.

17. The device of claim 16, wherein the first and second transistors act as resistors for the input termination circuit when the transistors are activated.

18. The device of claim 13, wherein the test circuit comprises an open/short test logic circuit and an on/off instruction logic circuit.

19. A method for controlling an input termination of a semiconductor memory device, comprising the steps of:
    in response to a test command signal, outputting a control signal to deactivate an input termination, when a testing procedure is to be performed for the semiconductor memory device; and
    deactivating a plurality of switches to electrically isolate the input termination, and thus prevent leakage current from flowing in the input termination during a test procedure.

20. The method of claim 19, wherein the step of outputting the control signal comprises receiving a test command by a test circuit and processing the test command to generate the control signal.

21. The method of claim 19, wherein the step of outputting the control signal comprises outputting a control signal applied to a pad.

* * * * *